United States Patent [19]

Jeuch et al.

[11] 4,455,193

[45] Jun. 19, 1984

[54] PROCESS FOR PRODUCING THE FIELD OXIDE OF AN INTEGRATED CIRCUIT

[75] Inventors: Pierre Jeuch, Seyssins; Pierre Parrens, Grenoble, both of France

[73] Assignee: Commissariat a l'Energie Atomique, Paris, France

[21] Appl. No.: 508,911

[22] Filed: Jun. 29, 1983

[30] Foreign Application Priority Data

Jul. 1, 1982 [FR] France .................................. 82 11570

[51] Int. Cl.³ .................... H01L 21/306; B44C 1/22; C03C 15/00; C03C 25/06
[52] U.S. Cl. .................................. 156/643; 29/571; 29/580; 148/187; 156/646; 156/653; 156/657; 156/659.1; 156/662; 252/79.1; 427/85; 427/93; 430/313; 430/317
[58] Field of Search .................... 29/571, 580, 576 W; 357/41, 49, 56, 53; 427/85, 93, 94; 430/313, 314, 316, 317; 148/1.5, 187; 156/643, 646, 653, 657, 659.1, 662, 668, 648, 649; 252/79.1

[56] References Cited

U.S. PATENT DOCUMENTS 4,378,627  4/1983  Jambotkar .................... 156/653 X
4,394,196  7/1983  Iwai ................................ 148/187
4,407,851  10/1983 Kurosawa et al. ............... 427/93 X

OTHER PUBLICATIONS

IBM Technical Disclosure Bulletin, vol. 23, No. 4, Sep. 1980, pp. 1405–1408, Device Isolation by Using a Narrow SiO₂ Trench, C. T. Horng and R. R. Konian.
IEEE Transactions on Electron Devices, vol. Ed-29, No. 4, Apr. 1982, pp. 541–547, Direct Moat Isolation for VLSI, K. L. Wang et al.
International Electron Devices Meeting, Washington, D.C., Dec. 7–9, 1981, IEEE, pp. 384–387, A New Bird's-Beak Free Field Isolation Technology for VLSI Devices, Kei Kurosawa et al.
IEEE Journal of Solid State Circuits, vol. SC-17, No. 2, Apr. 1982, pp. 191–197, Selective Polysilicon Oxidation Technology for VLSI Isolation, Naohiro Matsukawa et al.
IBM Technical Disclosure Bulletin, vol. 21, No. 5, Oct. 1978, pp. 1868–1869, Dielectric Isolation Planarization, T. A. Bartush et al.

*Primary Examiner*—William A. Powell
*Attorney, Agent, or Firm*—Oblon, Fisher, Spivak, McClelland & Maier

[57] ABSTRACT

Process for producing the field oxide of an integrated circuit, wherein it comprises the following successive stages:
(a) producing a resin mask on a first region of a doped semiconductor substrate, in which will be formed the active component of the integrated circuit,
(b) production of a first etching over a height h of a second region of the doped semiconductor substrate, in which it is wished to produce the field oxide,
(c) implantation of ions in the second region of the remaining substrate, giving a doping of the same type as that of the substrate,
(d) deposition of an insulating layer on the complete substrate,
(e) deposition of a resin layer on the insulating layer,
(f) production of a second simultaneous etching of the resin layer and the insulating layer, until the complete elimination of that region of the oxide layer positioned above the first region of the substrate in which will be produced the active component of the integrated circuit.

14 Claims, 10 Drawing Figures

PROCESS FOR PRODUCING THE FIELD OXIDE OF AN INTEGRATED CIRCUIT

BACKGROUND OF THE INVENTION

The present invention relates to a process for producing the field oxide of an integrated circuit. It more particularly applies to the production of MOS integrated circuits.

One of the main process for producing the field oxide is generally called the "LOCOS Process" and the different stages thereof are shown in FIGS. 1 to 4.

As shown in FIG. 1, the first stage of this process consists of thermally growing on a silicon substrate 2, e.g. type P silicon, a silicon oxide layer 4 of limited thickness, i.e. approximately 0.07 microns, then depositing a silicon nitride layer 6 on oxide layer 4 and which generally has a thickness of approximately 0.08 microns. After producing a resin mask 8 on region 6a of silicon nitride layer 6, positioned above the substrate region in which is subsequently produced the elementary component of the integrated circuit, e.g. the central region of the silicon nitride layer of FIG. 1, the silicon nitride layer 6 is etched, e.g. by plasma etching or attack. The thus obtained structure is shown in FIG. 2.

After etching the silicon nitride layer 6, through oxide layer 4, are implanted ions giving doping of the same type as that of the substrate. In substrate 2, this ion implantation makes it possible to obtain two lateral regions 10 and 12 e.g. of type P+ in the case of a type P substrate and an implantation of boron ions. This implantation takes place with a dose of $2.10^{12}$ atoms/cm$^2$ and an energy level of 140 keV for example.

The resin mask 8 is then eliminated. The following stage consists of producing the field oxide by thermal oxidation of the silicon, the active zones in which it is wished to produce the elementary components being masked by region 6a of the silicon nitride layer during said oxidation process. This leads to two lateral silica regions 14, 16 having a thickness which is generally between 0.6 and 0.8 microns.

This process is finished by eliminating region 6a of silicon nitride layer 6 and the region of oxide layer 4 positioned above the region of substrate 2 in which the component is subsequently formed. For example, this elimination takes place by a chemical attack. The thus obtained structure is shown in FIG. 4.

This process for producing the field oxide of an integrated circuit has a certain number of disadvantages.

In particular, the thermal oxidation stage for obtaining silica regions 14 and 16 is long and tedious. Thus, said thermal oxidation is carried out at a relatively low temperature of approximately 900° C. for approximately 10 hours. Moreover, this prolonged heat treatment leads to a diffusion of the implanted ions into regions 10 and 12 of the substrate. This redistribution of the ions, requires implantations and relatively strong dose levels.

In addition, this process for producing the field oxide has the major disadvantage of limiting the integration density of the integrated circuits. Thus, the field oxide produced by this process has a significant lateral extension L in FIG. 4.

SUMMARY OF THE INVENTION

The present invention relates to a process for producing the field oxide of an integrated circuit, which makes it possible to obviate these various disadvantages. In particular, this process makes it possible to obviate prolonged heat treatment, reduce the ion dose to be implanted and increase the integration density of integrated circuits.

More specifically, the present invention relates to a process for producing the field oxide of an integrated circuit, wherein it comprises the following successive stages:

(a) producing a resin mask on a first region of a doped semiconductor substrate in which will be formed the active component of the integrated circuit, (b) production of a first etching over a height h of a second region of the doped semiconductor substrate, in which it is wished to produce the field oxide, (c) implantation of ions in the second region of the remaining substrate, giving a doping of the same type as that of the substrate, (d) deposition of an insulating layer on the complete substrate, (e) deposition of a resin layer on the insulating layer, (f) production of a second simultaneous etching of the resin layer and the insulating layer, until the complete elimination of that region of the oxide layer positioned above the first region of the substrate in which will be produced the active component of the integrated circuit.

Preferably, said second etching of the resin layer and the oxide layer is performed at identical etching speeds for the resin and the insulant. According to a preferred embodiment of the invention, said second etching is performed by reactive ionic etching using a gaseous mixture containing trifluoromethane (CHF$_3$) and oxygen in adequate proportions. It is also possible to use other gases, such as a mixture of carbon tetrafluoride (CF$_4$) and oxygen, or sulphur hexafluoride (SF$_6$).

According to a preferred embodiment of the process according to the invention, at the start of the process a protective layer is deposited and initially this is etched with the mask defined in stage a.

The presence of this protective layer, made more particularly from silicon nitride, makes it possible to protect the surface of the semiconductor substrate from the different etching operations, thus preventing the formation of faults in the active areas of the substrate and the contamination of the latter.

According to another preferred embodiment of the invention, etching stage b is performed by an anisotropic etching process, such as e.g. reactive ionic etching. Such an anisotropic etching permits a better checking of the dimensions of the reactive areas and consequently an improved integration density.

According to a preferred embodiment of the invention, a sloping etching takes place of the first region of the substrate during stage (b).

According to an advantageous embodiment of the invention, sloping etching is carried out by means of a sloping profile of the resin mask produced during stage (a), as well as anisotropic reactive ionic etching.

According to a preferred embodiment of the invention, following stage (c) and prior to stage (d), there is a thermal oxidation of the substrate e.g. over a thickness of approximately 0.05 to 0.1 $\mu$m. Such a thermal oxide layer ensures a high quality interface between the substrate and the subsequently deposited insulating layer.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
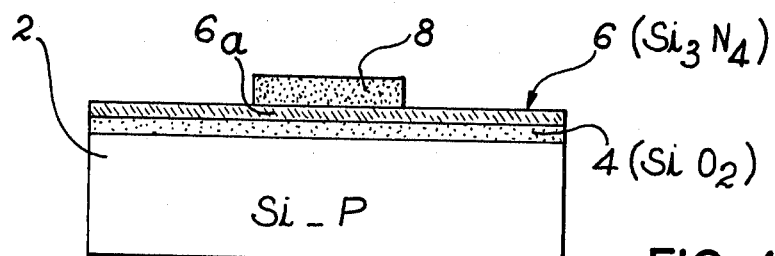
FIGS. 1 to 4, already described, diagrammatically the different stages of a process for producing the field oxide according to the prior art.
Figure 2:
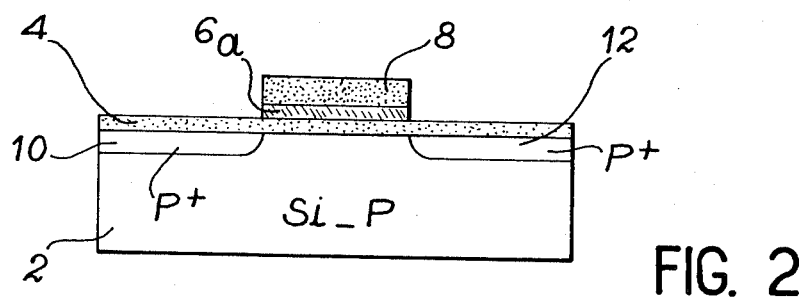
Figure 3:
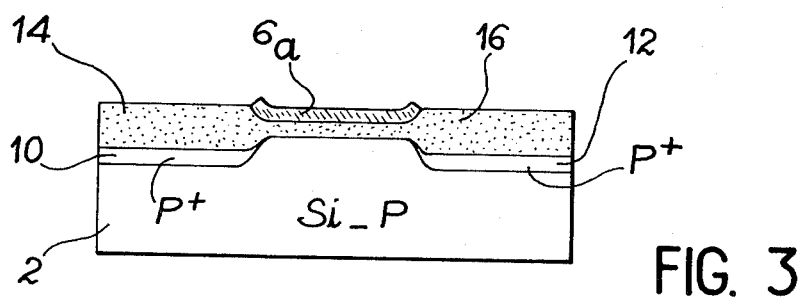
Figure 4:
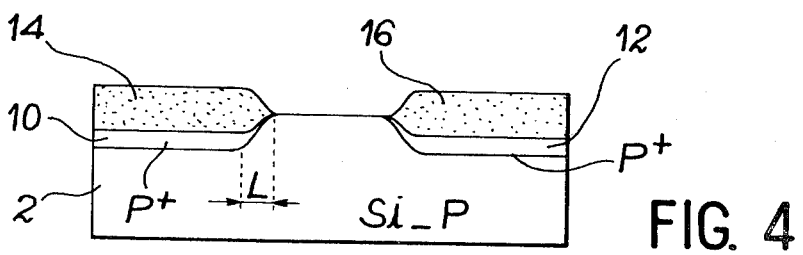
Figure 5:
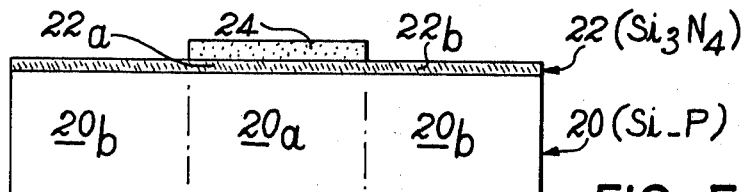
FIGS. 5 to 10, diagrammatically, the different stages of the process for producing the field oxide according to the invention.

With reference to FIG. 5, the first stage of the process according to the invention consists of depositing on a doped semiconductor substrate 20, e.g. of type P silicon, a protective layer 22, made e.g. from silicon nitride. Protective layer 22 makes it possible to prevent any subsequent contamination of substrate 20, during the different stages of the process according to the invention. This protective layer 22, deposited e.g. by vapour phase chemical deposition at low or zero pressure, has for example a thickness of 0.1 micron.

Figure 6:
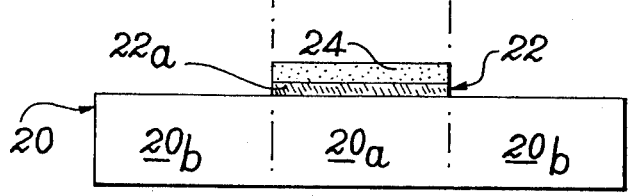

According to conventional microlithography processes, a resin mask 24 is then produced on the protective layer 22, so as to only mask region 22a of layer 22, located on region 20a of semiconductor substrate 20, in which will subsequently be formed the active component. This is followed by anisotropic etching of the protective layer 22, e.g. by means of reactive ionic etching using $SF_6$ (sulphur hexafluoride). This etching makes it possible to eliminate regions 22b of protective layer 22, positioned above regions 20b of semiconductor substrate 20, in which is produced the field oxide according to the invention. The structure obtained after this etching process is shown in FIG. 6.

Following the etching of protective layer 22, regions 20b of the substrate undergo a preferably anisotropic etching to height h of approximately 0.8 microns. For example, this etching takes place by means of reactive ionic etching using $SF_6$.

In order to obtain a sloping profile, before etching the protective layer and the substrate, the resin layer 24 can undergo a heat treatment, i.e. heating at approximately 120° C., or can be subject to the action of an oxygen plasma so as to slightly attack the resin. This heat treatment, or slight attacking or etching action makes it possible to obtain a sloping profile of resin mask 24 so that, during the anisotropic etching of the substrate, an inclined profile of substrate region 20a is obtained. The slope of this profile is a function of the slope of the profile of resin mask 24 and the respective etching speeds of the resin and the substrate during the etching of the latter.

The following stage of the process according to the invention, whilst still using the same mask 24 positioned on region 22a of protective layer 22, consists of implanting ions in what remains of the regions 20b of the substrate, said ions giving doping of the same type as that of the substrate. In the case of a type P silicon substrate, said implantations can be produced with boron ions with an energy level of 50 keV and a dose of $10^{12}$ atoms/cm$^2$. This implantation makes it possible to obtain lateral regions 28 and 30, e.g. of type P+.

Figure 7:
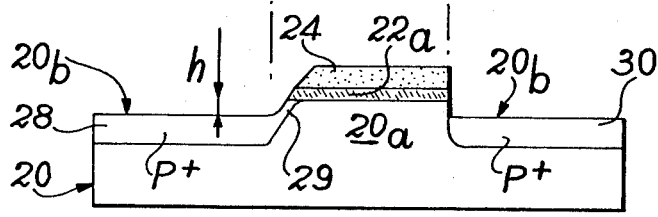

The use of a sloping profile for substrate region 20a, during ionic implantation, leads to the formation of an implanted region 29, e.g. of type P+ on the sides of region 20a and as shown in FIG. 7. During the production of a MOS transistor, the existence of this implanted region makes it possible to obviate the production of a parasitic channel on the sides of the transistor.

Following this ionic implantation and the elimination of the resin mask, the not shown substrate undergoes thermal oxidation over a thickness of e.g. 0.05 μm. This oxidation can be carried out at 900° C. for 1 hour. In the manner shown in FIG. 8, an insulating layer 32, made e.g. from silica, is deposited on the complete substrate 20 and region 22a of the remaining silicon nitride layer, e.g. by zero or low pressure, vapour phase chemical deposition. For example, insulating layer 32 has a thickness of 1 micron. The fact that the silica layer 32 is produced by deposition and not by thermal oxidation makes it possible to use, during ion implantation, a smaller ion quantity than that used during the prior art field oxide production processes, in view of the fact that there is no diffusion of ions into the substrate. Moreover, this makes it possible to completely eliminate lateral extensions of the oxide and consequently increase the integration density of the integrated circuits.

Figure 8:
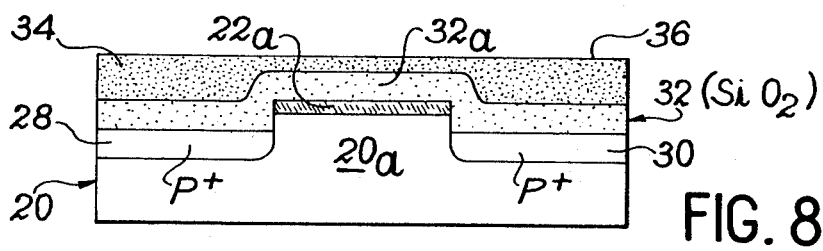

The following stage of the process consists of covering the oxide layer 32 with a resin layer 34. The latter can be of a resin of the type currently used in photolithography and has e.g. a thickness of 1.5 um. Following deposition, the resin layer 34 can undergo heat treatment, e.g. heating at a temperature of 200° C. for 30 minutes, in order to obtain a good spreading of the resin layer and consequently a flat surface 36, as shown in FIG. 8.

Figure 9:
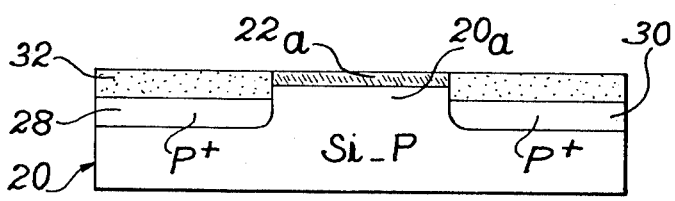

This is followed by simultaneous etching of resin layer 34 and oxide layer 32 at identical etching speeds until region 32a of oxide layer 32, positioned above substrate region 20a is completely eliminated. The control of the end of etching can take place by any known means. The structure obtained is shown in FIG. 9. This etching can be carried out e.g. by a mixture of trifluoromethane or tetrafluoromethane ($CHF_3$, $CF_4$) and oxygen. Fluorinated compounds are used for etching the oxide and oxygen for etching the resin. It is possible to use sulphur hexafluoride ($SF_6$) for this etching process.

Figure 10:
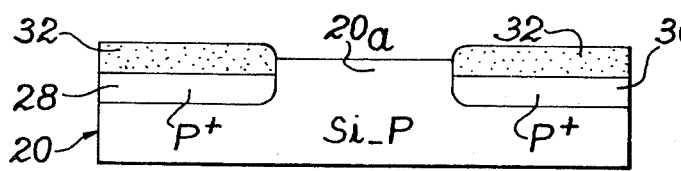

The final stage of the process according to the invention consists of eliminating region 22a of the remaining silicon nitride layer, e.g. by etching said region by a chemical etching process. The final structure obtained is shown in FIG. 10.

What is claimed is:

1. A process for producing the field oxide of an integrated circuit, wherein it comprises the following successive stages:
   (a) producing a resin mask on a first region of a doped semiconductor substrate, in which will be formed the active component of the integrated circuit,
   (b) production of a first etching over a height h of a second region of the doped semiconductor substrate, in which it is wished to produce the field oxide,
   (c) implantation of ions in the second region of the remaining substrate, giving a doping of the same type as that of the substrate,
   (d) deposition of an insulating layer on the complete substrate,
   (e) deposition of a resin layer on the insulating layer,
   (f) production of a second simultaneous etching of the resin layer and the insulating layer, until the complete elimination of that region of the oxide layer positioned above the first region of the substrate in which will be produced the active component of the integrated circuit.

2. A production process according to claim 1, wherein the second etching process is performed with identical etching speeds for the resin and the insulant.

3. A production process according to claim 1, wherein the second etching process is a reactive ionic etching in a gaseous mixture, either containing trifluoromethane and oxygen, or carbon tetrafluoride $CF_4$ and oxygen, or sulphur hexafluoride $SF_6$.

4. A production process according to claim 1, wherein between the resin mask and the substrate is positioned a protective layer and before performing stage (b), there is a third etching of a first region of the protective layer, said first region being located above the second region of the substrate.

5. A production process according to claim 4, wherein the third etching process is a reactive ionic etching.

6. A production process according to claim 4, wherein, after performing stage (f), there is a fourth etching of a second region of the protective layer, said second region being positioned above the first region of the substrate.

7. A production process according to claim 6, wherein the fourth etching process is a chemical etching.

8. A production proess according to claim 1, wherein the first region of the substrate undergoes sloping etching during stage (b).

9. A production process according to claim 8, wherein sloping etching is brought about by means of a sloping profile of the resin mask, effected during stage (a), and an anisotropic reactive ionic etching.

10. A production process according to claim 9, wherein, in order to obtain a sloping profile of the resin mask, said resin undergoes heat treatment after its development.

11. A production process according to claim 9, wherein, in order to obtain a sloping profile of the resin mask, said resin is subject to the action of an oxygen plasma following its development.

12. A production process according to claim 1, wherein the substrate undergoes thermal oxidation after stage (b) and before stage (d).

13. A production process according to claim 1, wherein the insulating layer is of silica.

14. A production process according to claim 1, wherein the protective layer is of silicon nitride.

* * * * *